(12) United States Patent
Hsu

(10) Patent No.: US 8,081,097 B2
(45) Date of Patent: Dec. 20, 2011

(54) ANALOG-TO-DIGITAL CONVERTER AND RELATED CALIBRATING COMPARATOR

(75) Inventor: Cheng-Chung Hsu, Hsin-Chu Hsien (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 63 days.

(21) Appl. No.: 12/817,133

(22) Filed: Jun. 16, 2010

(65) Prior Publication Data

US 2011/0102217 A1    May 5, 2011

(30) Foreign Application Priority Data

Nov. 4, 2009   (TW) ................................ 98137410 A

(51) Int. Cl.
*H03M 1/00*        (2006.01)

(52) U.S. Cl. ........ 341/120; 341/136; 341/155; 341/163; 341/172

(58) Field of Classification Search .................. 341/120, 341/136, 155, 163, 172
See application file for complete search history.

(56) References Cited

U.S. PATENT DOCUMENTS

| | | | |
|---|---|---|---|
| 6,400,302 B1 * | 6/2002 | Amazeen et al. | 341/172 |
| 6,608,582 B2 * | 8/2003 | Casper et al. | 341/155 |
| 7,161,512 B1 * | 1/2007 | Keskin | 341/118 |
| 7,741,981 B1 * | 6/2010 | Wan et al. | 341/110 |

* cited by examiner

*Primary Examiner* — Khai M Nguyen
(74) *Attorney, Agent, or Firm* — Winston Hsu; Scott Margo

(57) ABSTRACT

An analog-to-digital converter includes a sample and hold unit, a successive control unit, a look-up memory, and a calibrating comparator, which further includes a positive input end, a negative input end, a timing signal input end, a data port, a latch unit, an enable switch, a first controllable resistor, a second controllable resistor, a reset switch assembly, a controllable capacitive device, and an output end.

44 Claims, 8 Drawing Sheets

ANALOG-TO-DIGITAL CONVERTER AND RELATED CALIBRATING COMPARATOR

BACKGROUND OF THE INVENTION

1. Field of the Invention

The present invention is related to an Analog to Digital Converters (ADC), and particularly, related to an ADC which can save power consumption and occupy a small chip area.

2. Description of the Prior Art

Analog to Digital Converters (ADC) convert analog signals of the real world into digital data, so the digital data can be processed by Digital Signal Processors (DSP). As the information technology gets populated, many products include various types of multimedia functions; for example, the processing of the image and voice signals includes using ADC to convert the analog signals into the digital format, and the digital data is sent to DSP for further processing; finally, the processed result can be delivered to the output device, the network or some digital storage device. On the other hand, various types of sensors have been used; for example, a digital thermometer is using a temperature sensor to generate analog temperature signals, which are then converted into digital format by an ADC. The digital data can be then be processed, calibrated and displayed by the thermometer. For a broader view, especially in the medical, communication and control domains, the ADCs are getting more popular and almost can be found everywhere. Among them, a Successive Approximation Analog to Digital Converter (SAR ADC) is a special type of ADC, and is mostly utilized in the moderate- or low-speed (of data rate) applications.

Please refer to FIG. 1, which illustrates a schematic diagram of a Successive Approximation Analog to Digital Converter (SAR ADC) 10. The SAR ADC 10 comprises a sample and hold circuit 100, a comparator 102, a successive control unit 104 and a digital to analog converter (DAC) 106. The operations of the ADC 10 can be stated as follows. Firstly, the sample and hold circuit 100 samples an input signal VIN and outputs a sampled voltage VSIN. The comparator 102 compares the voltage level of the sampled voltage with an analog voltage VCOM, and the comparing result is outputted to the successive control unit 104. The successive control unit 104 will generate a digital data DK according to the comparing result produced by the comparator 102. The digital to analog converter 106 converts the digital data DK into an analog voltage VCOM, and output to the comparator 102.

Inside the ADC 10, the successive control unit 104 controls a repeating process for generating one more valid (less significant) bit according to the comparing result outputted by the comparator 102. The digital data DK thus includes increasing number of valid bits so that the analog voltage VCOM produced by the DAC 106 can get closer and closer to the sampled voltage VSIN, and the ADC 10 repeats this process till all the valid bits are generated. General speaking, the number of bits is closely related to the precision of the ADC 10, and as the number of valid bits increases, so does the precision as well as the cost of increasing number of the repeating processes.

However, traditional Successive Approximation Analog to Digital Converter (SAR ADC) must include an independent digital to analog converter (DAC) and some technical issues are thus brought up to table. Please refer to FIG. 2, which illustrates a schematic diagram of a 7-bit Charge-Redistribution SAR ADC 20. The ADC 20 comprises a sample and hold circuit 200 (not shown in FIG. 2), a comparator 202, a successive control unit 204, a DAC 206 and a reference voltage output unit 208. The ADC 20 is a special but popular type of the more general ADC 10. The ADC 20 utilizes a special charge redistribution technique to complete the analog-to-digital conversion process. The digital to analog converter 206 of the ADC 20 is formed by switches S0~S7 and capacitors C1~C7, and the capacitances of the capacitors C1~C7 are of specific but different values. Since the terminals of the capacitors C1~C7 are connected to the same voltage level, the capacitance of the capacitors C1~C7 will decide how much electric charges are being stored in each of the capacitors C1~C7. Since the different capacitances of the capacitors C1~C7 are having definite proportional relationships, such that the charge stored in the capacitors C1~C7 will also have the same definite proportional relationships; if not, the ADC won't work precisely. Meanwhile and most importantly, the charge vs. applied voltage of each of the capacitors C1~C7 should be precisely linear, such that the output result of the analog to digital conversion can be precise enough, and the metal-insulator-method capacitor (MIMC) are most qualified to the said requirements. In other words, in today's semiconductor technology, the capacitor using MIMC structure includes a much better linearity than other capacitor structures, including metal-oxide-semiconductor capacitor (MOSC). However, the capacitance per unit area of the MIMC is around $1\sim2(fF/m^2)$ and is far less than that of the MOSC, which is around $7(fF/m^2)$. In other words, for forming a capacitor of certain capacitance, the chip area occupied by the MIMC structure will be much more than that by the MOSC structure. However, the linearity of the MOSC is not as good as the MIMC, and is not good to be used under the structure of the ADC 20.

Besides that, both the ADC 10 and the special ADC 20 requires the digital to analog converter 206, which further needs the reference voltage output unit 208 to provide a reference voltage VREF. According to experimental results, the power consumed by the reference voltage output unit 208 almost takes a half of the power consumption of the ADC 20. However, the DAC 206 is an indispensable part of the ADC 20. The large power consumption of the reference voltage output unit 208 results in large power consumption of the ADC 20.

SUMMARY OF THE INVENTION

Therefore, the main objective of the present invention is to provide an ADC architecture and related calibrating comparator which can save power consumptions and occupy a small chip area.

The present invention discloses an analog-to-digital converter for saving power consumption, which comprises a sample and hold unit, coupled to an external differential input signal, for sampling, maintaining and outputting a differential sampling signal according to a sampling frequency signal; a successive control unit, coupled to a calibrating comparator, for outputting a memory address according to a comparing result of the calibrating comparator, and outputting a conversion result upon the completion of the analog-to-digital conversion process; a look-up memory, coupled to the calibrating comparator and the successive control unit, for outputting a digital data to a data port of the calibrating comparator; and a calibrating comparator. The calibrating comparator comprises a positive input end, for receiving a positive polarity signal of the differential sampling signal; a negative input end, for receiving a negative polarity signal of the differential sampling signal; a timing signal input end, for receiving a clock signal; a data port, for receiving a digital data; a latch unit, comprising a first comparing end, a second comparing end, a first output end and a second output end, and is utilized to compare the magnitude of a circuit parameter observed respectively in the first comparing end and the second comparing end, such that the state values of the first output end and the second output end can both be determined; an enable switch, comprising a first end, a second end coupled to the timing signal input end, and a third end coupled to a ground end, for controlling the conductions between the first end and the third end according to the magnitude of the clock signal; a first controllable resistor, coupled to the positive input end, the first comparing end of the latch unit and the first end of the enable switch, for regulating the resistance of the first controllable resistor according to the positive polarity signal of the differential sampling signal; a second controllable resistor, coupled to the negative input end, the second comparing end of the latch unit and the first end of the enable switch, for regulating the resistance of the second controllable resistor according to the negative polarity signal of the differential sampling signal; a reset switch assembly, coupled to the timing signal input end and the latch unit, for resetting the state of the latch unit according to the clock signal; a controllable capacitive device, coupled to the first comparing end and the second comparing end of the latch unit and the ground end, for controlling the observed capacitance in the first comparing end and the second comparing end; and an output end, coupled to the first output end of the latch unit, for outputting a comparing result.

The present invention further discloses an a calibrating comparator for using in an analog-to-digital converter, which comprises a positive input end, for receiving a positive polarity signal of the differential sampling signal; a negative input end, for receiving a negative polarity signal of the differential sampling signal; a timing signal input end, for receiving a clock signal; a data port, for receiving a digital data; a latch unit, comprising a first comparing end, a second comparing end, a first output end and a second output end, and is utilized to compare the magnitude of a circuit parameter observed respectively in the first comparing end and the second comparing end, such that the state values of the first output end and the second output end can both be determined; an enable switch, comprising a first end, a second end coupled to the timing signal input end, and a third end coupled to a ground end, for controlling the conductions between the first end and the third end according to the magnitude of the clock signal; a first controllable resistor, coupled to the positive input end, the first comparing end of the latch unit and the first end of the enable switch, for regulating the resistance of the first controllable resistor according to the positive polarity signal of the differential sampling signal; a second controllable resistor, coupled to the negative input end, the second comparing end of the latch unit and the first end of the enable switch, for regulating the resistance of the second controllable resistor according to the negative polarity signal of the differential sampling signal; a reset switch assembly, coupled to the timing signal input end and the latch unit, for resetting the state of the latch unit according to the clock signal; a controllable capacitive device, coupled to the first comparing end and the second comparing end of the latch unit and the ground end, for controlling the observed capacitance in the first comparing end and the second comparing end; and an output end, coupled to the first output end of the latch unit, for outputting a comparing result.

These and other objectives of the present invention will no doubt become obvious to those of ordinary skill in the art after reading the following detailed description of the preferred embodiment that is illustrated in the various figures and drawings.

DETAILED DESCRIPTION

In the prior art, the ADCs 10 and 20 must adopt capacitors with the metal-insulator-metal (MIM) structure, so that the chip area are relatively large, and it is mainly because the inherent limitations coming with the architectures of the ADCs 10 and 20. In other words, the ADCs 10 and 20 must use a capacitor with excellent linearity; if not, the converting results of the ADCs 10 and 20 will be incorrect. Besides that, by applying the reference voltage VREF in the ADCs 10 and 20, the power consumptions of the ADCs 10 and 20 are relatively large.

Figure 1:
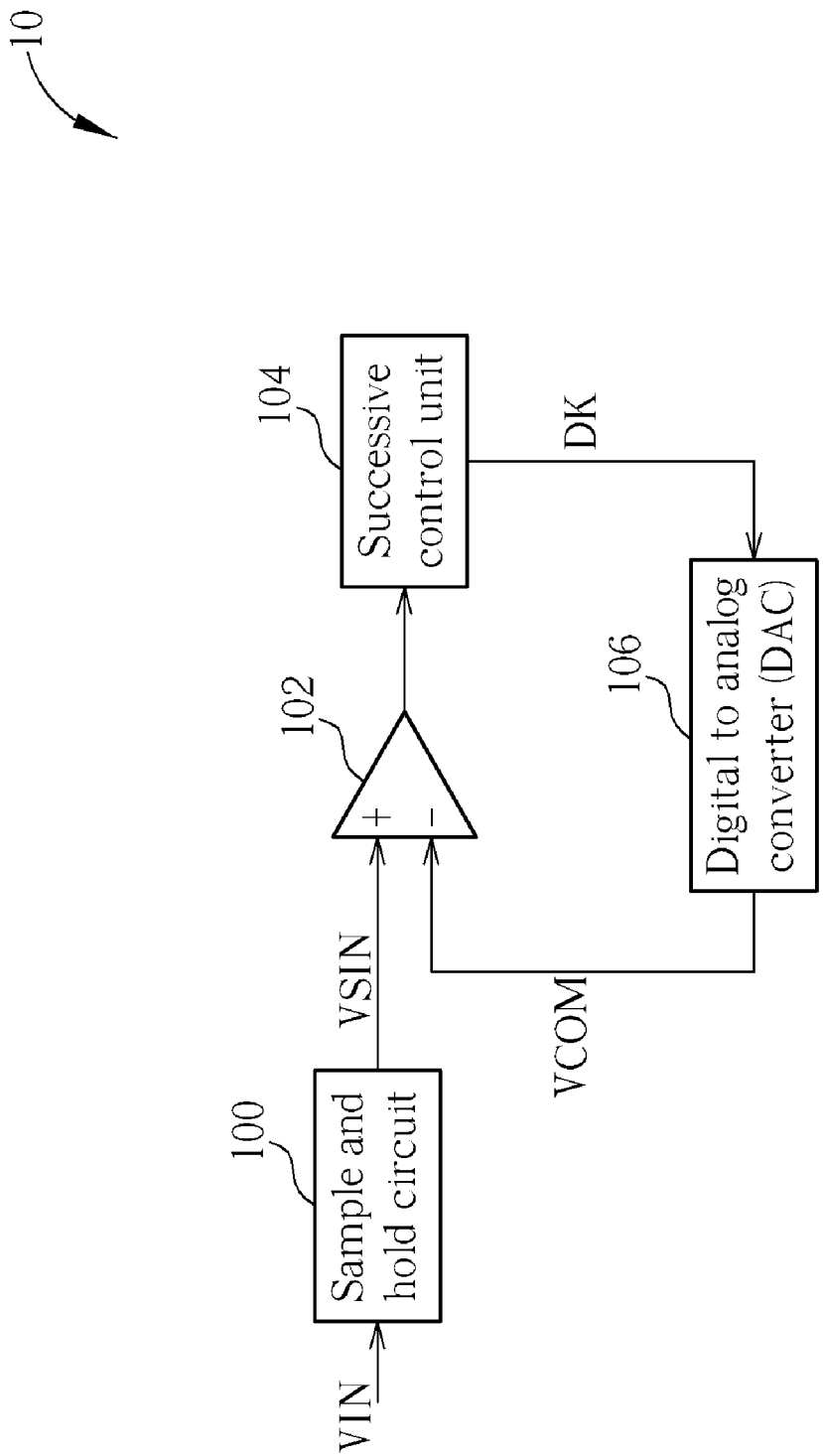
FIG. 1 illustrates a schematic diagram of a Successive Approximation Analog to Digital Converter of the prior art.
Figure 2:
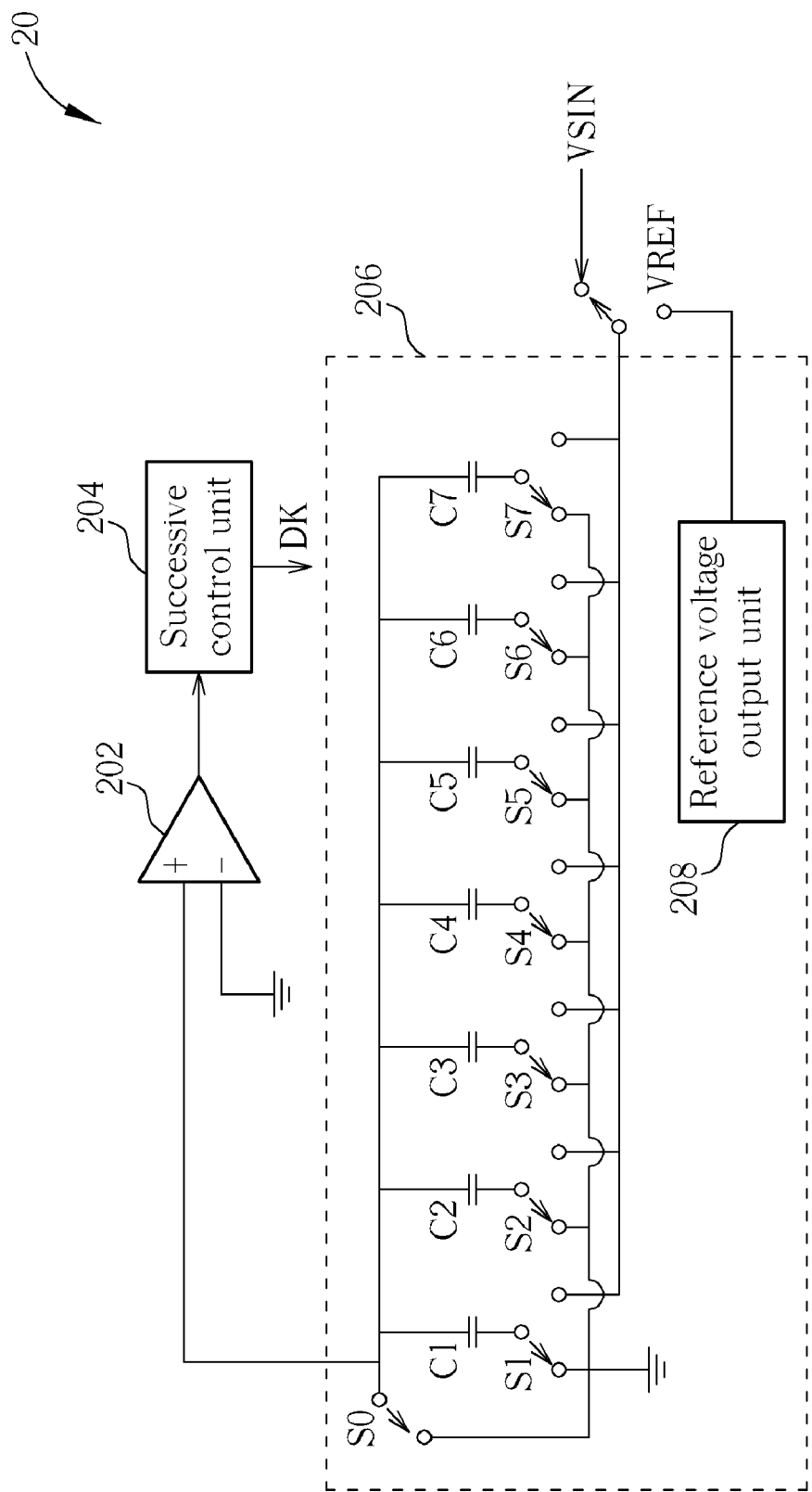
FIG. 2 illustrates a schematic diagram of a 7-bit Charge-Redistribution SAR ADC of the prior art.
Figure 3A:
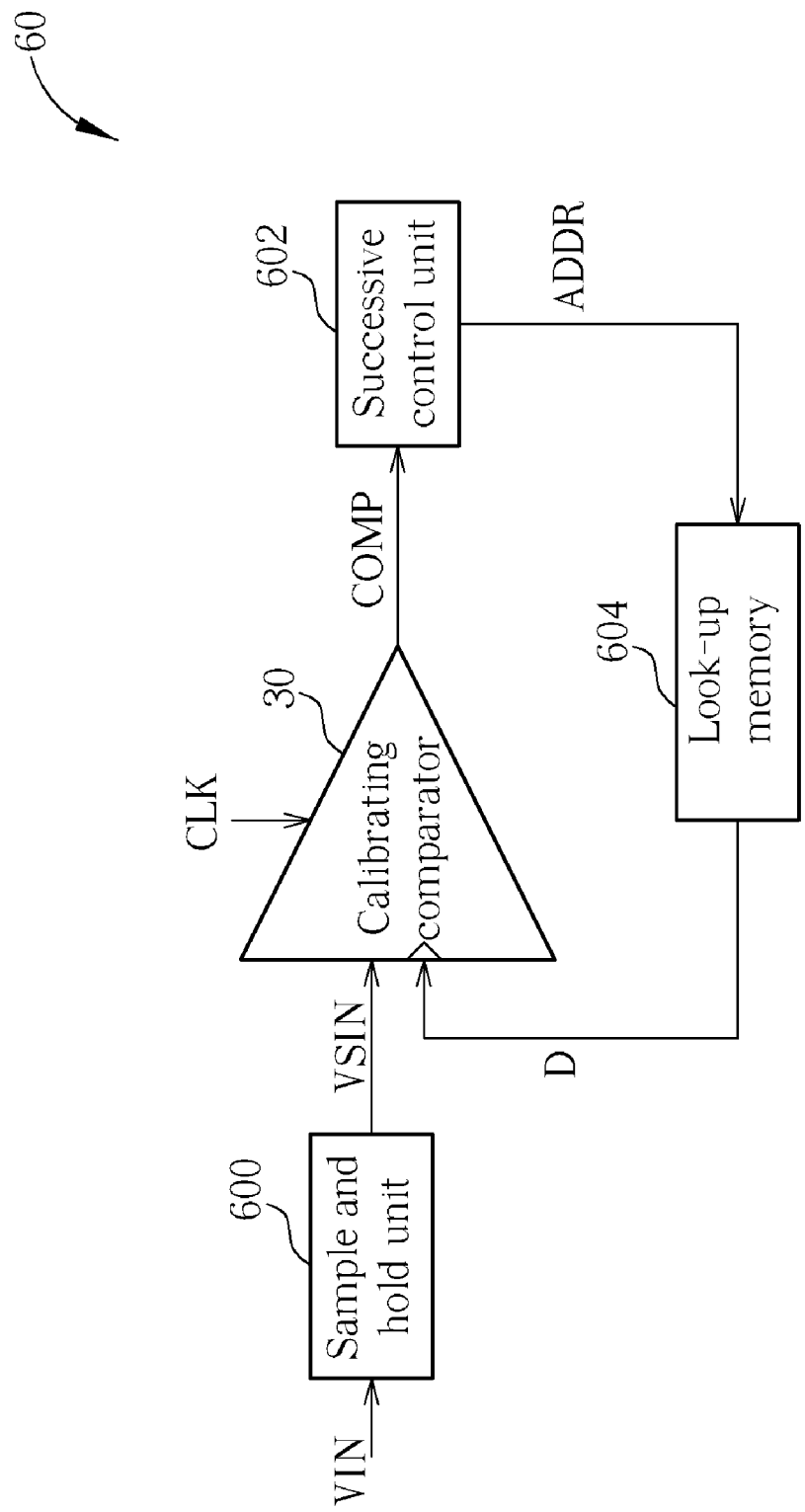
FIG. 3A illustrates a schematic diagram of an architecture of a Successive Approximation Analog to Digital Converter (SAR ADC) according to an embodiment of the present invention.

According to the main objective of the present invention, a novel structure is disclosed for a Successive Approximation Analog to Digital Converter (SAR ADC); also, by adopting a calibration mode and related operating method, the ADC of the present invention can use capacitors of imperfect linearity, and still gets accurate analog-to-digital converting result. Also, the present invention no longer needs a reference voltage VREF, as described in the prior art, such that the issue of large power consumption can also be solved. For clearly explaining the operating method and circuit of the present invention, the working principles and the preferred embodiments are described as follows:

Please refer to FIG. 3A, which illustrates a schematic diagram of an architecture of a Successive Approximation Analog to Digital Converter (SAR ADC) 60 according to an embodiment of the present invention. The ADC 60 comprises a sample and hold unit 600, a successive control unit 602, a look-up memory 604 and a calibrating comparator 30. Inside the ADC 60, the sample and hold unit 600 receives and samples an external differential input signal VIN, according to a sampling frequency signal or clock signal (not shown in FIG. 3A), and the sample and hold unit 600 outputs a differential sampled signal VSIN to the calibrating comparator 30. The successive control unit 602 coupled to the calibrating comparator 30 and the look-up memory 604, and is utilized to control the successive operations of the analog-to-digital converting process. The successive control unit 602 updates a memory address ADDR to the look-up memory 604 in each cycle of the successive operations according to the comparing result COMP outputted by the calibrating comparator 30. And, the successive control unit 602 will output the final converting result when all the successive operations of the analog-to-digital converting process complete. The look-up memory 604 is coupled to the calibrating comparator 30 and the successive control unit 602, and is utilized to output a digital data D to the calibrating comparator 30 according to the memory address ADDR provided by the successive control unit 602.

For providing proper calibrating functions to the ADC 60, a calibrating module must be attached. Please refer to FIG. 3B, which illustrates a schematic diagram of a calibrating module 70 for the SAR ADC 60. The calibrating module 70 is utilized to operate in the calibrating mode to calibrate the ADC 60. The calibrating module 70 comprises a standard voltage source 700, a voltage selecting switch 702, a calibrating controller 704, a counter 706 and a memory 708. While in the calibrating mode, the standard voltage source 700 is utilized to provide certain numbers of standard voltages VD_1~VD_N according to a ceiling voltage value VA and a floor voltage value VB. Preferably, those standard voltages VD_1~VD_N are evenly distributed between the ceiling voltage value VA and the floor voltage value VB, and this can be realized by applying a number of resistors R_1~R_K, and connected them in series; then, one end of the (resistor) series circuit can be connected to the ceiling voltage value VA and the other end to the floor voltage value VB. The standard voltages VD_1~VD_N can then be extracted from the inner nodes of the series circuit for further usages. The voltage selecting switch 702 is coupled to the standard voltage sources 700, for selecting a standard voltage SVD from the standard voltages VD_1~VD_N, and outputting the standard voltage SVD to the calibrating comparator 30. The counter 706 is coupled to the calibrating comparator 30, and is utilized to provide a digital data DD, wherein the digital data DD is utilized to slowly regulate the Equivalent Offset Voltage (EOV) of the calibrating comparator 60. More detailed, when the voltage selecting switch 702 newly selects a standard voltage SVD from the standard voltages VD_1~VD_N, the counter 706 can be initiated to count up from the smallest value, or to count down from the largest value, and the calibrating comparator 60 compares the Equivalent Offset Voltage (EOV) with the standard voltage SVD, and outputs a comparing result to decide whether the counter 706 should keep counting up/down for the current standard voltage SVD. In other words, when the comparing result indicates that the standard voltage SVD is equal to the Equivalent Offset Voltage (EOV), the counter 706 will stop the current counting process, and the process is switched to calibrate for the next updated standard voltage SVD. Noticeably, it is unlikely for the standard voltage SVD to be exactly equal to the Equivalent Offset Voltage (EOV), but the comparing result can indicate the state(s) whereupon the Equivalent Offset Voltage (EOV) is most close to the current standard voltage SVD.

Figure 3B:
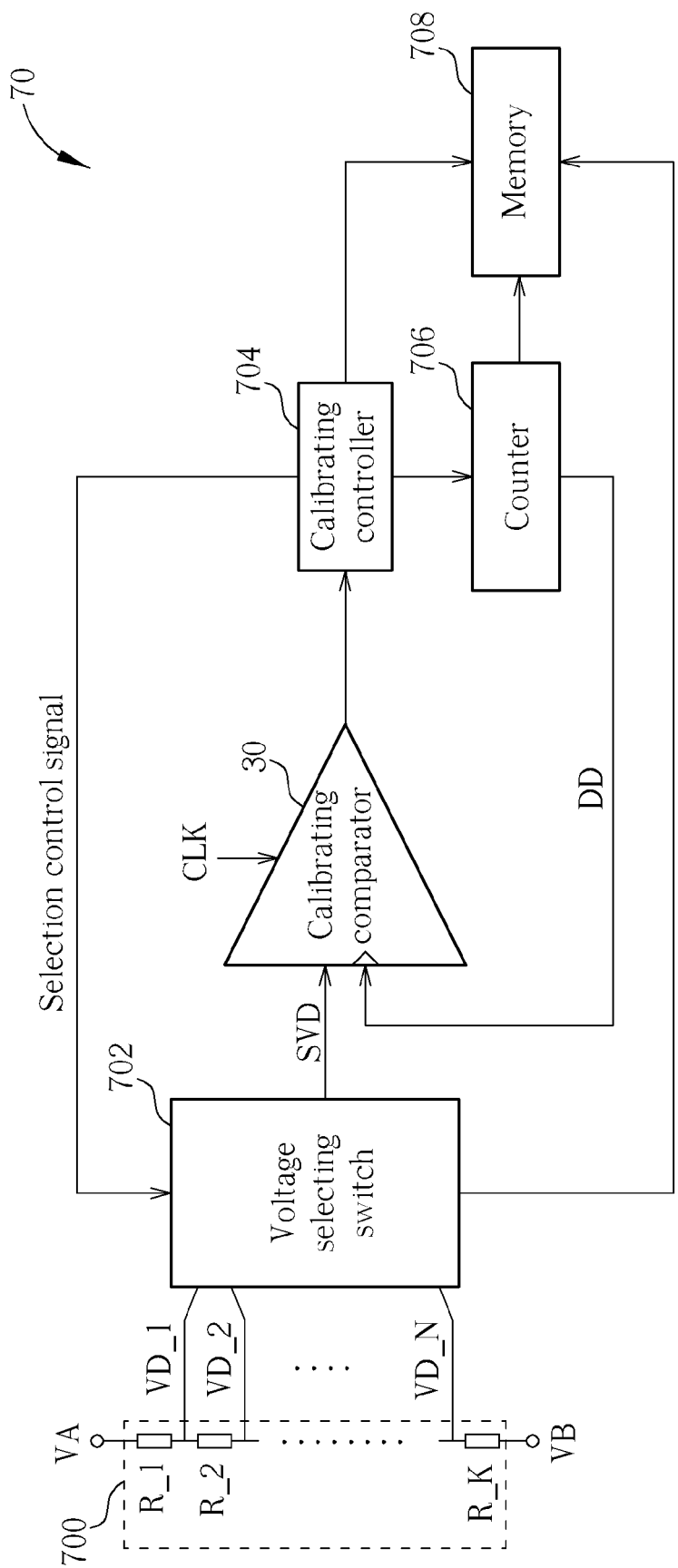
FIG. 3B illustrates a schematic diagram of a calibrating module of the SAR ADC shown in FIG. 3A.

Besides that, in FIG. 3B, the memory 708 is coupled to the counter 706 and the voltage selecting switch, and is utilized to record the current value of the counter 706 and the current standard voltage SVD (or an index number corresponding to the standard voltage SVD) when the calibrating comparator indicates that the Equivalent Offset Voltage (EOV) equals the current standard voltage SVD. Preferably, the memory 708 is the look-up memory 704 commonly shared with the ADC 60. On the other hand, suppose there are N standard voltages VD_1~VD_N, after the calibrating process completes, there will be N corresponding data in the memory 708. Besides that, the calibrating controller 704 is connected to the voltage selecting switch 702, the counter 706 and the memory 708, and is utilized to control the voltage selecting switch 702, the counter 706 and the memory 708 according to the comparing result of the calibrating comparator 30. In brief, when the voltage selecting switch 704 selects a new standard voltage SVD from the standard voltages VD_1~VD_N, the calibrating controller 704 will order the counter 706 to initiate the counting process. And, when the calibrating comparator 30 indicates that the Equivalent Offset Voltage (EOV) is equal to or is most close to the current standard voltage SVD, the calibrating controller 704 will order the memory 708 to record the current standard voltage value SVD (or an index number corresponding to the standard voltage SVD) and the current value of the counter 706. By following this process, each of the standard voltages VD_1~VD_N can be calibrated.

After the calibrating module 70 completes the calibrating process, the present invention can switch the ADC 60 from the calibrating mode to the normal mode and get ready for performing the functions of analog-to-digital conversion. The techniques of implementing the switching control between the data paths of the calibrating mode and the data paths of the normal mode of the ADC 60 should be readily understood by the people with ordinary knowledge in the art, and the circuit of the said data path switching control is not to be shown explicitly on the figures or to be detailed further.

Figure 3C:
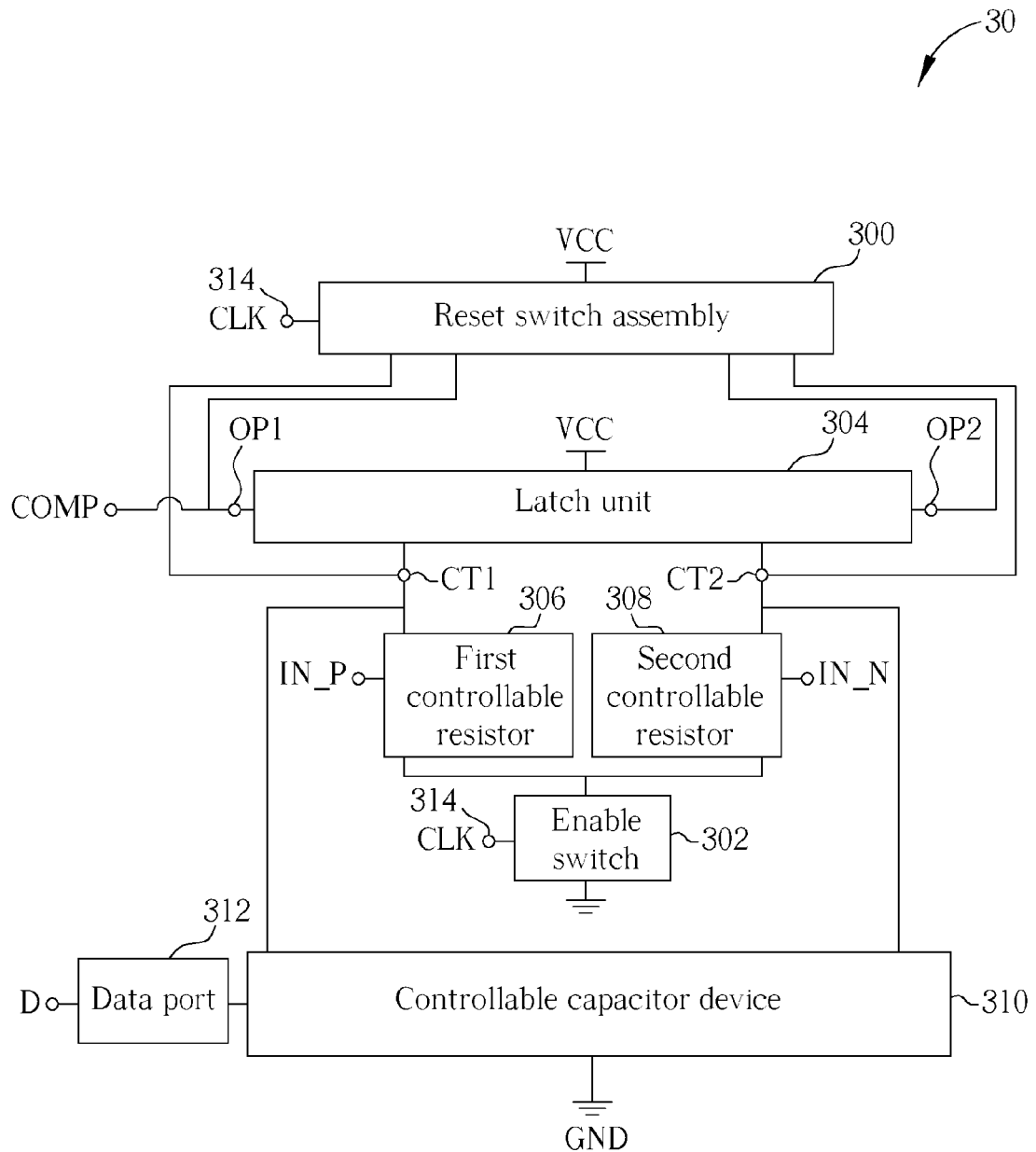
FIG. 3C illustrates a schematic diagram of a calibrating comparator according to an embodiment of the present invention.

About the detail structure of the calibrating comparator 30, please refer to FIG. 3C, which illustrates a schematic diagram of a calibrating comparator 30 according to an embodiment of the present invention. The calibrating comparator 30 comprises a positive input end IN_P, a negative input end IN_N, a timing signal input end 314, a data port 312, a latch unit 304, an enable switch 302, a first controllable resistor 306, a second controllable resistor 308, a reset switch assembly 300 and a controllable capacitive device 310. The positive input end IN_P and the negative input end IN_N is to receive respectively the positive polarity signal and the negative polarity signal of the differential sampling signal. After the input differential signal VIN has been sampled and hold, it has become the differential sampling signal VSIN, and the positive polarity signal of the differential sampling signal VSIN is connected to the positive input end IN_P of the calibrating comparator 30, and the negative polarity signal of the differential sampling signal VSIN is connected to the negative input end IN_N of the calibrating comparator 30. Besides, in the calibrating mode, the voltage selecting switch 702 can select a voltage from the N standard voltages VD_1~VD_N, and output the voltage as the standard voltage SVD to the positive input end IN_P of the calibrating comparator 30 (the negative input end is connected to the ground), such that each of the N standard voltages VD_1~VD_N can be calibrated by the calibrating comparator 30. Next, the timing signal input end 314 is utilized to receive a clock signal CLK as the timing basis for the calibrating comparator 30. The digital data port 312 is utilized to receive a digital data D, and can receive data up to N bits of binary data D_1~D_N. The latch unit 304 comprises a first comparing end CT1, a second comparing end CT2, a first output end OP1 and a second output end OP2. The latch unit 304 is utilized to compare the magnitude difference of the circuit parameters between the first comparing end CT1 and the second comparing end CT2, such that the output state of the first output end OP1 and the second output end OP2 can be decided. The enable switch 302 is utilized to control the signal connections between the controllable resistors 306, 308 and the GND, and is for enabling the comparing process. The first controllable resistor 306 and second controllable resistor 308 connect respectively to the positive input end IN_P and the negative input end IN_N of the differential sampling signal VSIN, and the differential sampling signal VSIN regulates the resistance of the first controllable resistor 306 and second controllable resistor 308. The reset switch assembly 300 is utilized to control (or reset) the state of the latch unit 304 according to the clock signal CLK. Preferably, when the clock signal CLK is reset to a predetermined voltage (LOW in this case), the reset switch assembly 300 can reset the voltages of the first comparing end CT1, the second comparing end CT2, the first output end OP1 and the second output end OP2 to a voltage HIGH (or VCC). The controllable capacitive device 310 connected to the first comparing end CT1, a second comparing end CT2 and the ground GND, and is utilized to control the capacitance observed in the first comparing end CT1 and the capacitance observed in the second comparing end CT2, according to the digital data D. Besides, the designer can select either from the first output end OP1 and the second output end OP2 to read the state of the calibrating comparator, but please also note that they are of opposite polarity. In FIG. 3C, the circuit selects the first output end OP1 as the terminal to output the comparing result COMP.

To be detailed further, the reset switch assembly 300 is to conduct the signals while the clock signal asserted LOW, and the first comparing end CT1, the second comparing end CT2, the first output end OP1 and the second output end OP2 are all pull HIGH as their initial states. While the clock signal is asserted HIGH, the enable switch 302 conducts, and the calibrating comparator starts the comparing process. The latch unit 304 compares the magnitudes of circuit parameters (the observed resistance and/or capacitance) to decide the final state of the current comparing process. Preferably, the circuit parameters can be the resistance, or the capacitance or the product of the resistance and capacitance. Therefore, when the calibrating comparator 30 just starts comparing, the voltages in the first comparing end CT1 and the second comparing end CT2 are reset to the same voltage (both equal to VCC), however, since the difference in the observed circuit parameters are different in the two comparing ends CT1, CT2, the one end (CT1 or CT2) whose product value of the observed resistance and capacitance is higher will approach to the low voltage with less speed, and vice versa. For example, when the voltage of the first comparing end CT1 decays with a higher speed, the first output end OP1 will be asserted HIGH in the final stable state; on the contrary, if the second comparing end CT2 decays faster than the first comparing end, the first output end OP1 will be asserted LOW, and the second output end OP2 will be asserted HIGH. In FIG. 3, the final stable state exhibited in the first output end OP1 is taken to be the output result COMP of the calibrating comparator 30.

Therefore, utilizing the differential sampling signal to control the first controllable resistor 306 and the second controllable resistor 308, the present invention can change the resistance observed in the first input end CT1 and the second input end CT2. Meanwhile, utilizing the digital data D received in the data port 312 to control the controllable capacitive device 310, the present invention can change the capacitance observed in the first input end CT1 and the second input end CT2. Altogether, the comparing result of the calibrating comparator 30 will be determined by comparing the product of the resistance and capacitance in the first input end CT1 and the second input end CT2. Besides that, when the resistance observed in the first input end CT1 and the second input end CT2 are both fixed, the present invention can also regulate the capacitance only to determine the comparing result of the calibrating comparator 30; or, when the capacitance observed in the first input end CT1 and the second input end CT2 are both fixed, the present invention can also regulate the resistance only to determine the comparing result of the calibrating comparator 30.

For example, the present invention can fix the differential sampling signal, such that the resistance of the first input end CT1 and the second input end CT2 are both fixed. Meanwhile, by changing the digital data D in the data port 312, regulate the controllable capacitive device 310, successively change the capacitance observed in the first comparing end CT1 relative to the second comparing end CT2, and watch the comparing result of the calibrating comparator 30. When the comparing results of the calibrating comparator 30 indicates the circuit parameters of the first comparing end CT1 and the second comparing end CT2 are most close to each other, the calibrating comparator 30 will record the current corresponding relationship between the differential sampling signal and the digital data D. Preferably, this corresponding relationship will be used to represent a standard voltage value by a digital data D. Therefore, the present invention can utilize this working principle, and perform calibration to the calibrating comparator 30. More details of the calibrating can be found as follows.

Noteworthily, after applying the received data in the digital port 312, the controllable capacitive device 310 will result in a voltage difference between the first comparing end CT1 and the second comparing end CT2 owing to the imbalance effect in the input ends, and the present invention refer this voltage difference as the Equivalent Offset Voltage (EOV). The Equivalent Offset Voltage is originally used to describe the imbalance phenomena usually observed in the input ends of an operational amplifier, and this imbalance in the input voltage is mainly derived from the variations of the IC manufacturing process and the imperfections of the circuit design. The present invention intentionally brings imbalance factors to the input ends of the operational amplifier, such that an EOV can be generated on the input ends of the calibrating comparator 30, and then applies this artificial imbalance to compare the magnitude of the input signals. Therefore, the calibrating comparator 30 can be utilized as a device to compare the differential sampling signal and the EOV, which can be varied according to the data received in the digital port 312. Preferably, when the differential sampling signal is greater than the EOV, the calibrating comparator 30 will output a voltage HIGH as the comparing result; on the contrary, when the differential sampling signal is less than the EOV, the calibrating comparator 30 will output a voltage LOW as the comparing result.

Briefly speaking, the calibrating comparator 30 is to determine the final stable state of the latch unit 304 according to both the differential voltage received in the input ends IN_P and IN_N, and the digital data received in the data port 312, and the final state of the latch unit 304 is utilized to be the comparing result of the calibrating comparator 30. The calibrating comparator 30 can be utilized to transfer the digital data D into an Equivalent Offset Voltage (EOV) and the EOV is then utilized to compare with an external voltage signal (the input differential signal). On the other hand, the calibrating comparator 30 can also be utilized to perform a calibration process according to an external standard voltage value, such that each standard voltage value can correspond to a specific digital data D.

Figure 4:
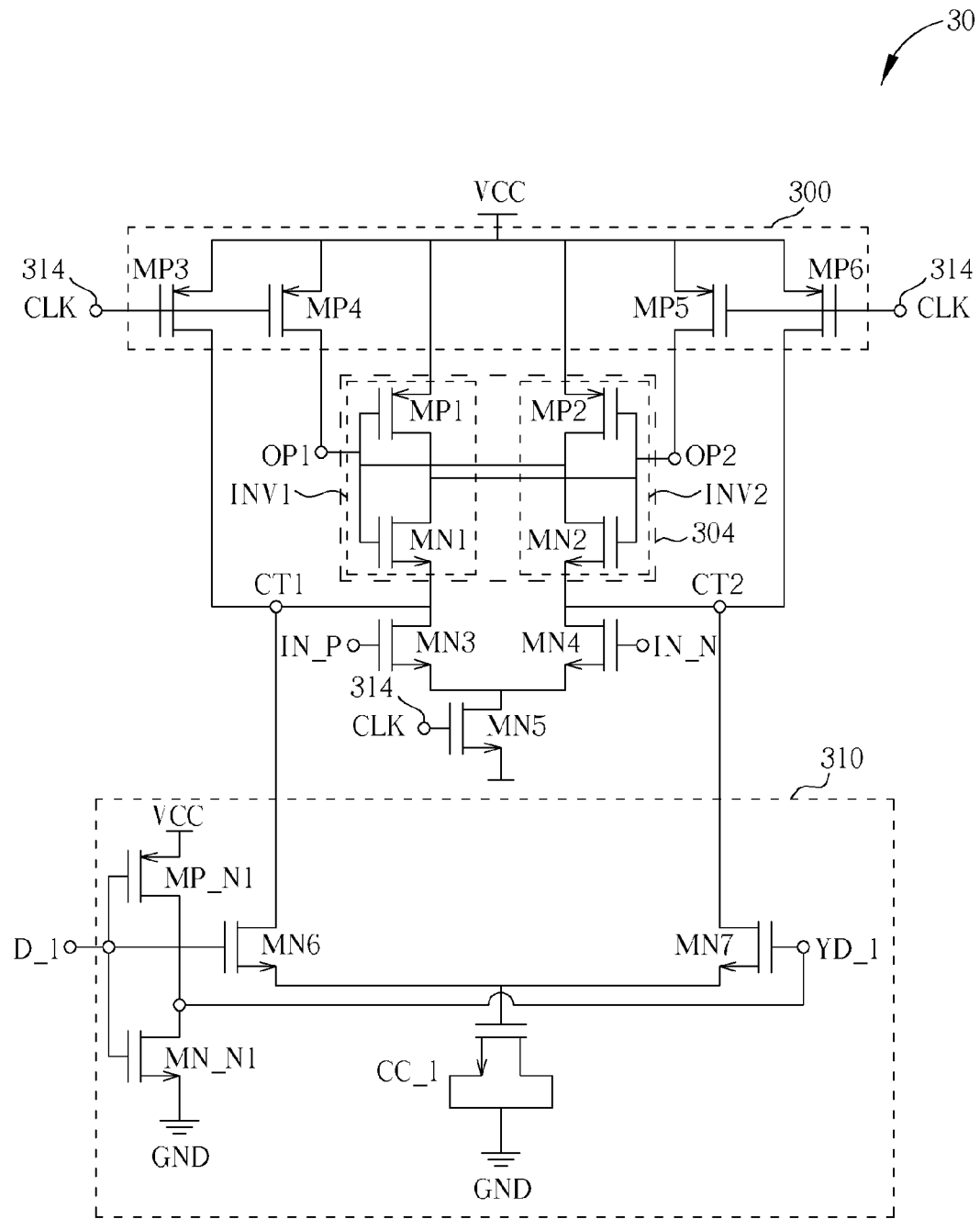
FIG. 4 illustrates a controllable capacitive device controlled by a single binary digit of a digital data.

It should be aware of that FIG. 3C is a schematic diagram of an embodiment of the present invention; people who is skilled in the art will readily observe that numerous modifications and alterations of the device and method may be made while retaining the teachings of the invention. For example, please refer to FIG. 4, which illustrates a circuit diagram of a calibrating comparator 30. In FIG. 4, the first controllable resistor 302 and the second controllable resistor 308 are realized by transistors MN3 and MN4, respectively. The gate ends of the first controllable resistor 302 and the second controllable resistor 308 are connected respectively to the positive input end IN_P and the negative input end IN_N, and are utilized for receiving the differential sampling signal VSIN. The enable switch 302 can be realized by the transistor MN5, and is able to conduct current while the clock signal CLK is asserted HIGH, and is utilized to initiate the comparing process of the calibrating comparator 30. The reset switch assembly 300 is formed by transistors MP3, MP4, MP5 and MP6, and each transistor is used as a switch, and can conduct current while the clock signal CLK is asserted LOW, so that the first comparing end CT1, the second comparing end, the first output end OP1 and the second output end OP2 are all being reset to a HIGH voltage. The latch unit 304 is realized by transistors MN1, MP1, MN2 and MP2. The transistors MN1 and MP1 forms a first inverter INV1, and the transistors MN2 and MP2 forms a second inverter INV2. The output end of the first inverter INV1 is connected to the input end of the second inverter INV2, and the output end of the second inverter INV2 is connected to the input end of the first inverter INV1. The inverters INV1 and INV2 thus realize a latch device 304 which can display a bi-stable behavior and store one bit of binary data. Since the first input end CT1 is coupled to the source end of transistor MN1, if the source end of the transistor MN1 is relatively higher, then the driving capability of the first inverter INV1 (formed by MP1 and MN1) will be less strong. If, meanwhile, the source voltage of the transistor MN2 is relatively low, then the driving capability of the second inverter INV2 (formed by MP2 and MN2) will be stronger. In this case, the inverter (INV1 or INV2) which has stronger driving capability will decide the final output state of the latch unit 304, and the second inverter INV2 (formed by MP2 and MN2), which has stronger driving capability, will drive the output state (voltage) of the first output end to be LOW. On the contrary, if the source voltage of the transistor MN1 is relatively low, then the first inverter INV1 (formed by MP1 and MN1) will have greater driving capability, such that the output state (voltage) of the first output end will become HIGH.

Noteworthily, according to the working principles of the circuit, in a field-effect transistor, the conductivity between the drain and the source will increase if the electric field between the drain and the source increases; therefore, by controlling the potential difference between the gate and the source, the conductivity between the drain and the source can be changed. More specifically, with the transistor (MN3 or MN4) of equal dimension, the conductivity between the drain and the source will be proportional to the channel resistance of the transistor, so that the channel resistance of the transistor can be changed by varying the voltage difference between the gate and the source of the transistor. Preferably, the controllable resistors 306 and 308 can be realized by transistors MN3 and MN4, respectively.

Besides that, please refer to FIG. 4 for clearly explaining the functions of the controllable capacitive device 310. FIG. 4 illustrates a controllable capacitive device 310 controlled by a single binary digit of digital data D_1. The controllable capacitive device 310 comprises a positive-side switch SP_1, a negative-side switch SN_1, an inverter INV_1 and a capacitor CC_1. The positive-side switch SP_1 and the negative-side switch SN_1 can be realized by the transistors MN6 and MN7, wherein the transistor MN6 are used to control the connection between the first comparing end CT1 and the capacitor CC_1, and the transistor MN7 is used to control the connection between the second comparing end CT2 and the capacitor CC_1. The inverter INV_1 is realized by transistors MP_N1 and MN_N1, and is utilized to generate the inverting signal YD_1 of the digital data D_1. The capacitor CC_1 is realized by a metal-dioxide-semiconductor capacitor (MOSC), and is utilized to supply the capacitance which can be observed from the first comparing end CT1 and the second comparing end CT2.

Figure 5A:
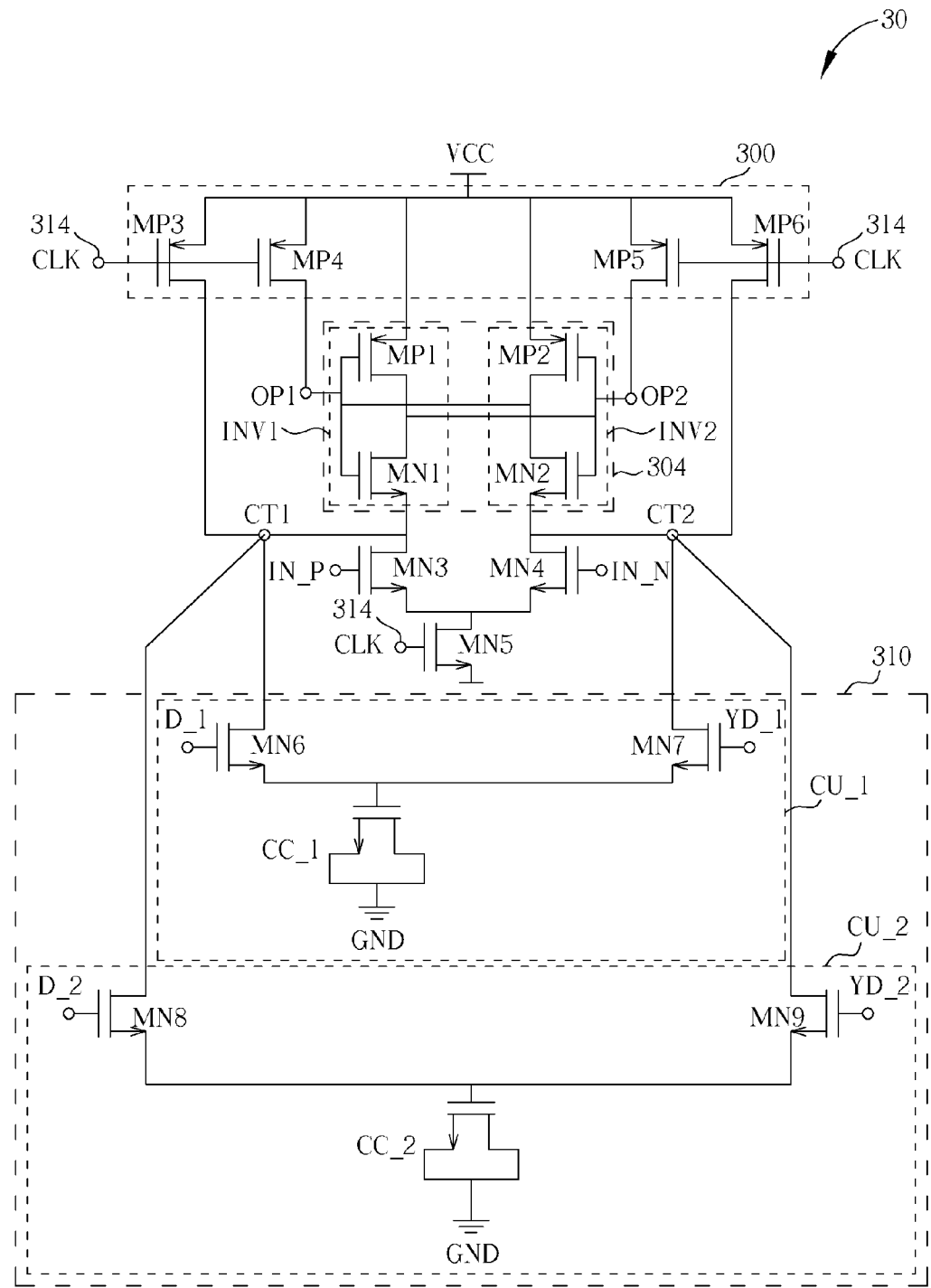
FIG. 5A illustrates an alternative embodiment of a calibrating comparator according to an embodiment of the present invention.

Inside the FIG. 4, the controllable capacitive device 310 comprises only one capacitor; in fact, the controllable capacitive device 310 may comprise more than one capacitor for performing more sophisticated functions. Please refer to FIG. 5A, which illustrates an alternative embodiment of the calibrating comparator 30. FIG. 5A demonstrates a controllable capacitive device 310 may comprise more than one controllable capacitive subunit; in FIG. 5, the controllable capacitive device 310 comprises two controllable capacitive subunits CU_1 and CU_2, and a 2-bit digital data D (including bit D_1 and D_2) is utilized to control the two controllable capacitive subunits CU_1 and CU_2, respectively. The controllable capacitive subunit CU_1 comprises a positive side switch formed by a transistor MN6, a negative side switch formed by a transistor MN7, an inverter (not shown in the figure) and a capacitive component CC_1 preferably formed by a metal-dioxide-semiconductor capacitor (MOSC). The gate of the transistor MN6 is connected to the binary data D__1, and the gate of the transistor MN7 is connected to the binary data YD_1 (the inverting signal of D_1). On the other hand, the controllable capacitive subunit CU_2 comprises a positive side switch formed by a transistor MN8, a negative side switch formed by a transistor MN9, an inverter (not shown in the figure) and a capacitive component CC_2 preferably formed by a metal-dioxide-semiconductor capacitor (MOSC). The gate of the transistor MN8 is connected to the binary data D_2, and the gate of the transistor MN9 is connected to the binary data YD_2 (the inverting signal of D_2). Noticeably, the capacitance of the capacitive component CC_2 is twice the capacitance of the capacitive component CC_1; therefore, by manipulating the values of the binary data D_1 and D_2, it can have up to 4 different levels of capacitance which can be observed in the first comparing end CT1 and the second comparing end CT2. Besides this difference, the rest of the operation methods is identical to the embodiment shown in FIG. 4, and won't be detailed further.

Figure 5B:
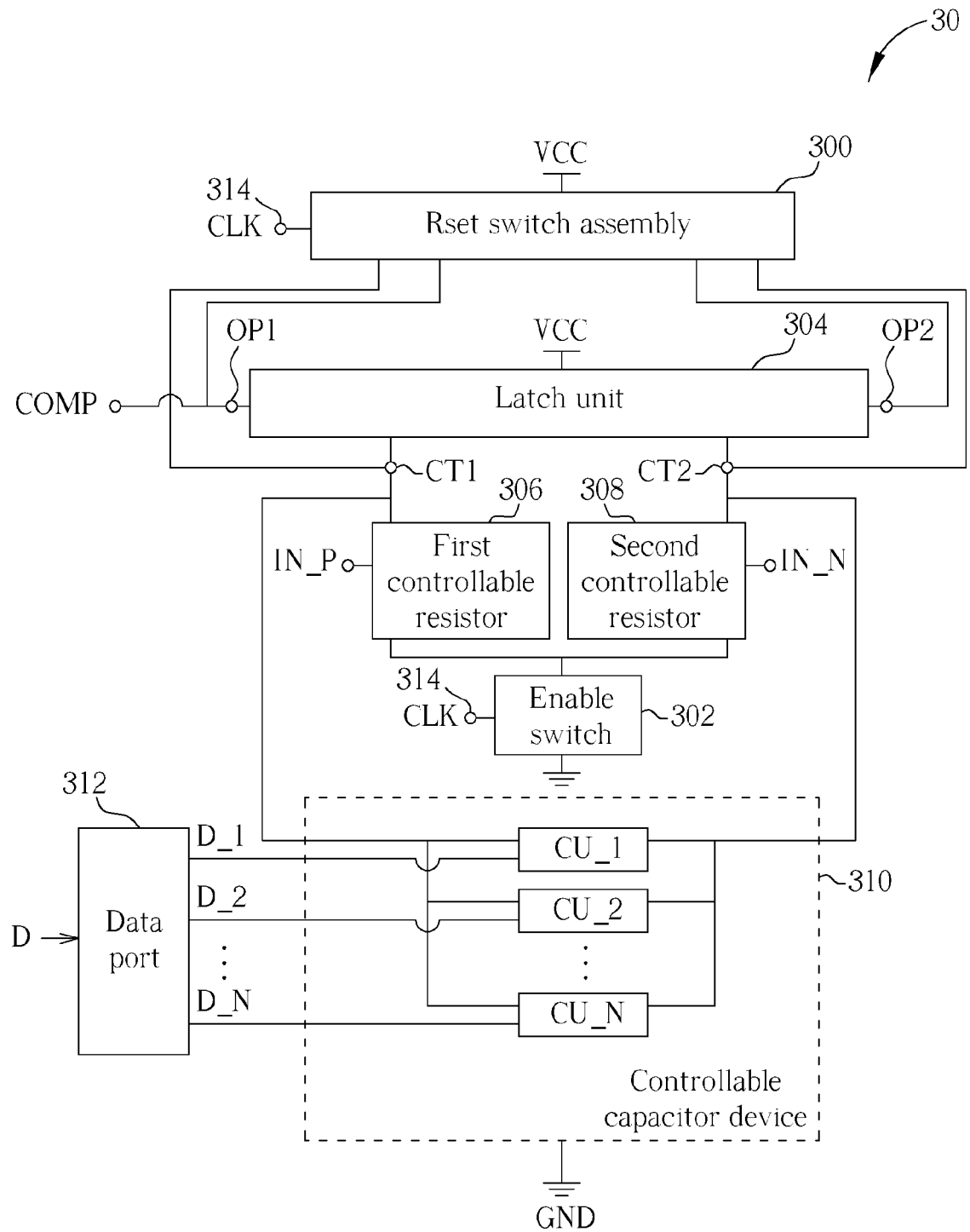
FIG. 5B illustrates another alternative embodiment of a calibrating comparator according to an embodiment of the present invention.

Please refer to FIG. 5B, which illustrates another alternative embodiment of the calibrating comparator 30. FIG. 5B demonstrates a controllable capacitive device 310 comprising N controllable capacitive subunits CU_1~CU_N. Each of the controllable capacitive subunits CU_1~CU_N comprises a positive side switch, a negative side switch, an inverter and a capacitor. Therefore, those N controllable capacitive subunits CU_1~CU_N totally have N positive side switches SP_1~SP_N, N negative side switches SN_1~SN_N, N inverters INV_1~INV_N and N capacitors CC_1~CC_N. Also, the capacitance of the capacitors CC_1~CC_N demonstrates a specific relationship—from CC_1 to CC_N, the capacitance of each capacitor represents an increasing power of 2, with the CC_1 having the smallest capacitance, and the CC_N the largest, and so on. Also in FIG. 5B, a data port 312 is utilized to receive a digital data D of N bits (including N binary data D_1~D_N). Preferably, the digits in the digital data D demonstrates a one-to-one correspondence between the N binary data D_1~D_N and the N controllable capacitive subunits CU_1~CU_N, and the digital data D represents a binary number, which can also be used to represent the magnitude of a voltage level. Also, since the capacitance of each capacitor represents an increasing power of 2, each of the controllable capacitive subunits CU_1~CU_N can be connected its corresponding binary data. For example, D_1 is connected to CU_1, D_2 is connected to CU_2, . . . , and D_N is connected to CU_N, such that the magnitude of the digital data D (including N binary data D_1~D_N) corresponds to the magnitude of the capacitance observed in the first comparing end CT1 and the second comparing end CT2, and there are totally 2^N levels of capacitance can be observed. Therefore, the designer can control the magnitude of the observed capacitance in the first comparing end CT1 and the second comparing end CT2 by changing value of the digital data D, and so 2^N different levels of the EOV can be generated for comparing with the differential sampling signal. Besides this difference, the rest of the operation methods is identical to the embodiment shown in FIG. 4 and FIG. 5A, and won't be detailed further.

Therefore, when the digital to analog conversion results needs more accuracy in bits, the calibrating comparator 30 can expand the number of the controllable capacitive subunits CU_1~CU_N and increase correspondingly the number of bits in the digital data D, then the accuracy can be increased for the analog to digital conversion. Besides that, since the capacitors CC_1~CC_N of the controllable capacitive subunits can be made of metal-dioxide-semiconductor capacitors (MOSC), the total chip area can be saved. According to the experiment, the capacitance per unit area for the metal-dioxide-semiconductor capacitor (MOSC) is approximately equal to $7(fF/m^2)$. Therefore, the chip area made of the metal-dioxide-semiconductor capacitor (MOSC) is much less than that of the common metal-insulator-metal capacitor (MIMC), whose capacitance per unit area is approximately equal to 1~2 $(fF/m^2)$.

The structure and the working principle and constituting components of the present invention have been described. Briefly speaking, based on architecture and operating principles of the calibrating comparator, a novel architecture for an analog-to-digital converter can be established. The calibrating comparator utilizes successive process to perform a plurality of comparing actions, and each comparing action will generate one more valid bit for the converting result; meanwhile, the EOV which corresponding to the digital data D can approach successively to the differential sampling signal VSIN. Also, the memory address ADDR corresponding to the digital data D is corresponding to the EOV of the calibrating comparator 30. The successive control unit 602 will judges and generates a new memory address ADDR and outputs to the look-up memory 604 for each comparing action, and is used for generating the corresponding EOV for the next comparing action. In other words, the calibrating comparator 30 utilizes the digital data D outputted by the look-up memory 604, and to control the controllable capacitive subunits CU_1~CU_N (please refer to FIG. 5B about the functions of the digital data D and the controllable capacitive subunits CU_1~CU_N) to generate the EOV for the next comparing action to approach the differential sampling signal VSIN. Each time the successive control unit 602 makes a new judgment for a new memory address ADDR, the analog-to-digital converter 60 will generate a new valid bit; by following this circulation, all the valid bits can be generated. Noteworthily, for meeting the precision requirements, the number of bits of the digital data D outputted by the look-up memory 604 should at least greater than the number of bits of the memory address ADDR outputted by the calibrating comparator 30.

Till this point, it can be understood that the calibrating comparator 30 of the ADC 60 is to integrate the digital to analog conversion functions; therefore the digital to analog converter (DAC) 106 can be removed, and the power can be saved. Besides that, the ADC 60 can perform the calibration function during the system power-up process, or anytime when redoing the calibrating process is required. While this happened, the calibrating process will establish or update the functional relationship between the digital data D and the Equivalent Offset Voltage (EOV) of the calibrating comparator 30 in the look-up memory 604.

Briefly speaking, a major difference between the present invention and the prior art is that the present invention utilizes a calibrating comparator which can integrate the digital-to-analog conversion function, such that the digital to analog conversion unit of the prior art can be discarded. Meanwhile, the reference voltage source of the prior art, which is included in the digital to analog conversion unit can also be removed, such that lots of power can be saved. By performing specific calibrating procedure, the ADC of the present invention can memorize the functional relationship between the digital data and the Equivalent Offset Voltage (EOV) of the calibrating comparator, such that the present invention can perform accurate analog-to-digital conversion without using the capacitor components of excellent linearity. By using the MOS capacitor, which is of larger capacitance per unit area but of less perfect linearity, the chip area can be greatly saved.

To sum up, by designing a unique architecture for a novel digital to analog converter, and to replace the digital to analog converter of the prior art, the present invention can greatly reduce the power consumption and decrease the chip area such that the user's convenience can be advanced.

Those skilled in the art will readily observe that numerous modifications and alterations of the device and method may be made while retaining the teachings of the invention.

What is claimed is:

1. An analog-to-digital converter for saving power consumption, comprising:
    a sample and hold unit, coupled to an external differential input signal, for sampling, maintaining and outputting a differential sampling signal according to a sampling frequency signal;
    a successive control unit, coupled to a calibrating comparator, for outputting a memory address according to a comparing result of the calibrating comparator, and outputting a conversion result upon the completion of the analog-to-digital conversion process;
    a look-up memory, coupled to the calibrating comparator and the successive control unit, for outputting a digital data to a data port of the calibrating comparator; and
    a calibrating comparator, comprising:
        a positive input end, for receiving a positive polarity signal of the differential sampling signal;
        a negative input end, for receiving a negative polarity signal of the differential sampling signal;
        a timing signal input end, for receiving a clock signal;
        a data port, for receiving a digital data;
        a latch unit, comprising a first comparing end, a second comparing end, a first output end and a second output end, and is utilized to compare the magnitude of a circuit parameter observed respectively in the first comparing end and the second comparing end, such that the state values of the first output end and the second output end can both be determined;
        an enable switch, comprising a first end, a second end coupled to the timing signal input end, and a third end coupled to a ground end, for controlling the conductions between the first end and the third end according to the magnitude of the clock signal;
        a first controllable resistor, coupled to the positive input end, the first comparing end of the latch unit and the first end of the enable switch, for regulating the resistance of the first controllable resistor according to the positive polarity signal of the differential sampling signal;

a second controllable resistor, coupled to the negative input end, the second comparing end of the latch unit and the first end of the enable switch, for regulating the resistance of the second controllable resistor according to the negative polarity signal of the differential sampling signal;

a reset switch assembly, coupled to the timing signal input end and the latch unit, for resetting the state of the latch unit according to the clock signal;

a controllable capacitive device, coupled to the first comparing end and the second comparing end of the latch unit and the ground end, for controlling the observed capacitance in the first comparing end and the second comparing end; and an output end, coupled to the first output end of the latch unit, for outputting a comparing result.

2. The analog-to-digital converter of claim 1 further comprising a calibrating module for calibrating the analog-to-digital converter.

3. The analog-to-digital converter of claim 2, wherein the calibrating module comprises:

a standard voltage source, for providing a plurality of standard voltages within a ceiling voltage and a floor voltage;

a voltage selecting switch, coupled to the standard voltage source, for selecting a standard voltage from the plurality of the standard voltages, and outputting the selected standard voltage to the positive input end;

a counter, for providing a counter value;

a memory, couple to the counter, for recording the counter value in the memory in an address corresponding to the selected standard voltage; and a calibrating controller, coupled to the calibrating comparator, for controlling the memory to record the counter value in an address corresponding to the selected standard voltage, while the comparing result of the calibrating comparator indicates the two comparing objects are approximately equal.

4. The analog-to-digital converter of claim 1, wherein the first controllable resistor is an n-type metal oxide semiconductor field effect transistor (MOSFET), a drain of the MOSFET is coupled to the first comparing end of the latch unit, a gate of the MOSFET is coupled to the positive input end, and a source is coupled to the first end of the enable switch.

5. The analog-to-digital converter of claim 1, wherein the second controllable resistor is an n-type metal oxide semiconductor field effect transistor (MOSFET), a drain of the MOSFET is coupled to the second comparing end of the latch unit, a gate of the MOSFET is coupled to the negative input end, and a source is coupled to the first end of the enable switch.

6. The analog-to-digital converter of claim 1, wherein the enable switch is an n-type metal oxide semiconductor field effect transistor, the first end of the enable switch is a drain, the second end is a gate, and the third end is a source.

7. The analog-to-digital converter of claim 1, wherein the reset switch assembly comprises:

a first reset switch, comprising a first end coupled to a voltage source, a second end coupled to the timing signal input end, and a third end coupled to the first comparing end of the latch unit, for controlling the conduction between the first end and the third end according to the clock signal;

a second reset switch, comprising a first end coupled to a voltage source, a second end coupled to the timing signal input end, and a third end coupled to the first comparing end of the latch unit, for controlling the conduction between the first end and the third end according to the clock signal;

a third reset switch, comprising a first end coupled to a voltage source, a second end coupled to the timing signal input end, and a third end coupled to the second comparing end of the latch unit, for controlling the conduction between the first end and the third end according to the clock signal; and a fourth reset switch, comprising a first end coupled to a voltage source, a second end coupled to the timing signal input end, and a third end coupled to the second comparing end of the latch unit, for controlling the conduction between the first end and the third end according to the clock signal.

8. The analog-to-digital converter of claim 7, wherein the first reset switch, the second reset switch, the third reset switch and the fourth reset switch are p-type metal oxide semiconductor field effect transistors, the first end of each reset switch is a source, the second end is a gate, and the third end is a drain.

9. The analog-to-digital converter of claim 7, wherein the latch unit comprises:

a first inverter, coupled to the first comparing end, the first output end and the second output end, for outputting the inverting signal of the first output end to the second output end according to the signal in the first comparing end; and a second inverter, coupled to the second comparing end, the first output end and the second output end, for outputting the inverting signal of the second output end to the first output end according to the signal in the second comparing end.

10. The analog-to-digital converter of claim 9, wherein the first inverter comprises:

a p-type metal oxide semiconductor field effect transistor, having a gate coupled to the first output end, a source coupled to a voltage source, and a drain coupled to the second output end; and an n-type metal oxide semiconductor field effect transistor, having a gate coupled to the first output end, a source coupled to the first comparing end, and a drain coupled to the second output end.

11. The analog-to-digital converter of claim 9, wherein second inverter comprises:

a p-type metal oxide semiconductor field effect transistor, having a gate coupled to the second output end, a source coupled to a voltage source, and a drain coupled to the first output end; and an n-type metal oxide semiconductor field effect transistor, having a gate coupled to the second output end, a source coupled to the second comparing end, and a drain coupled to the first output end.

12. The analog-to-digital converter of claim 1, wherein the controllable capacitive device further comprises:

a capacitor, comprising a first end, and a second end coupled to a ground end;

a positive side switch, comprising a first end coupled to the first comparing end of the latch unit, a second end for receiving the digital data, and a third end coupled to the capacitor, for controlling the conduction between the first end and the third end according to the digital data;

an inverter, for providing the inversion the digital data; and a negative side switch, comprising a first end coupled to the second comparing end of the latch unit, a second end coupled to the inverter, and a third end coupled to the first end of the capacitor, for controlling the conduction between the first end and the third end according to the inversion of the digital data.

13. The analog-to-digital converter of claim 12, wherein the positive side switch is an n-type metal oxide semiconductor field effect transistor, the first end of the positive side switch is a drain, the second end is a gate, and the third end is a source.

14. The analog-to-digital converter of claim 12, wherein the negative side switch is an n-type metal oxide semiconductor field effect transistor, the first end of the positive side switch is a drain, the second end is a gate, and the third end is a source.

15. The analog-to-digital converter of claim 1, wherein the circuit parameter is a resistance value.

16. The analog-to-digital converter of claim 1, wherein the circuit parameter is a capacitance value.

17. The analog-to-digital converter of claim 1, wherein the circuit parameter is a product of a resistance value and a capacitance value.

18. The analog-to-digital converter of claim 1, wherein the capacitor is a Metal-Oxide-Semiconductor Capacitor.

19. The analog-to-digital converter of claim 1, wherein the controllable capacitive device further comprises:
a plurality of capacitors, each comprising a first end, and a second end coupled to a ground end;
a plurality of positive side switches, each comprising a first end coupled to the first comparing end of the latch unit, a second end for receiving the digital data, and a third end coupled to a corresponding capacitor, for controlling the conduction between the first end and the third end according to the corresponding digital data;
a plurality of inverters, for providing the inversion the corresponding digital data; and
a plurality of negative side switches, each comprising a first end coupled to the second comparing end of the latch unit, a second end coupled to the corresponding inverter, and a third end coupled to the first end of the corresponding capacitor, for controlling the conduction between the first end and the third end according to the inversion of the corresponding digital data.

20. The analog-to-digital converter of claim 19, wherein the capacitance value of the plurality of capacitors presents an increasing power of 2.

21. The analog-to-digital converter of claim 19, wherein the plurality of the capacitors are Metal-Oxide-Semiconductor Capacitors.

22. The analog-to-digital converter of claim 19, wherein the plurality of the positive side switches are n-type metal oxide semiconductor field effect transistors, the first end of the positive side switch is a drain, the second end is a gate, and the third end is a source.

23. The analog-to-digital converter of claim 19, wherein the plurality of the negative side switches are n-type metal oxide semiconductor field effect transistors, the first end of the positive side switch is a drain, the second end is a gate, and the third end is a source.

24. A calibrating comparator for using in an analog-to-digital converter, comprising:
a positive input end, for receiving a positive polarity signal of a differential sampling signal;
a negative input end, for receiving a negative polarity signal of the differential sampling signal;
a timing signal input end, for receiving a clock signal;
a data port, for receiving a digital data;
a latch unit, comprising a first comparing end, a second comparing end, a first output end and a second output end, and is utilized to compare the magnitude of a circuit parameter observed respectively in the first comparing end and the second comparing end, such that the state values of the first output end and the second output end can both be determined;
an enable switch, comprising a first end, a second end coupled to the timing signal input end, and a third end coupled to a ground end, for controlling the conductions between the first end and the third end according to the magnitude of the clock signal;
a first controllable resistor, coupled to the positive input end, the first comparing end of the latch unit and the first end of the enable switch, for regulating the resistance of the first controllable resistor according to the positive polarity signal of the differential sampling signal;
a second controllable resistor, coupled to the negative input end, the second comparing end of the latch unit and the first end of the enable switch, for regulating the resistance of the second controllable resistor according to the negative polarity signal of the differential sampling signal;
a reset switch assembly, coupled to the timing signal input end and the latch unit, for resetting the state of the latch unit according to the clock signal;
a controllable capacitive device, coupled to the first comparing end and the second comparing end of the latch unit and the ground end, for controlling the observed capacitance in the first comparing end and the second comparing end; and
an output end, coupled to the first output end of the latch unit, for outputting a comparing result.

25. The calibrating comparator of claim 24, wherein the first controllable resistor is an n-type metal oxide semiconductor field effect transistor (MOSFET), a drain of the MOSFET is coupled to the first comparing end of the latch unit, a gate of the MOSFET is coupled to the positive input end, and a source is coupled to the first end of the enable switch.

26. The calibrating comparator of claim 24, wherein the second controllable resistor is an n-type metal oxide semiconductor field effect transistor (MOSFET), a drain of the MOSFET is coupled to the second comparing end of the latch unit, a gate of the MOSFET is coupled to the negative input end, and a source is coupled to the first end of the enable switch.

27. The calibrating comparator of claim 24, wherein the enable switch is an n-type metal oxide semiconductor field effect transistor, the first end of the enable switch is a drain, the second end is a gate, and the third end is a source.

28. The calibrating comparator of claim 24, wherein the reset switch assembly comprises:
a first reset switch, comprising a first end coupled to a voltage source, a second end coupled to the timing signal input end, and a third end coupled to the first comparing end of the latch unit, for controlling the conduction between the first end and the third end according to the clock signal;
a second reset switch, comprising a first end coupled to a voltage source, a second end coupled to the timing signal input end, and a third end coupled to the first comparing end of the latch unit, for controlling the conduction between the first end and the third end according to the clock signal;
a third reset switch, comprising a first end coupled to a voltage source, a second end coupled to the timing signal input end, and a third end coupled to the second comparing end of the latch unit, for controlling the conduction between the first end and the third end according to the clock signal; and a fourth reset switch, comprising a first end coupled to a voltage source, a second end coupled to the timing signal input end, and a third end coupled to the second comparing end of the latch unit, for controlling the conduction between the first end and the third end according to the clock signal.

29. The calibrating comparator of claim 28, wherein the first reset switch, the second reset switch, the third reset switch and the fourth reset switch are p-type metal oxide semiconductor field effect transistors, the first end of each reset switch is a source, the second end is a gate, and the third end is a drain.

30. The calibrating comparator of claim 24, wherein the latch unit comprises:

a first inverter, coupled to the first comparing end, the first output end and the second output end, for outputting the inverting signal of the first output end to the second output end according to the signal in the first comparing end; and a second inverter, coupled to the second comparing end, the first output end and the second output end, for outputting the inverting signal of the second output end to the first output end according to the signal in the second comparing end.

31. The calibrating comparator of claim 30, wherein the first inverter comprises:

a p-type metal oxide semiconductor field effect transistor, having a gate coupled to the first output end, a source coupled to a voltage source, and a drain coupled to the second output end; and an n-type metal oxide semiconductor field effect transistor, wherein a gate is coupled to the first output end, a source is coupled to the first comparing end, and a drain is coupled to the second output end.

32. The calibrating comparator of claim 30, wherein second inverter comprises:

a p-type metal oxide semiconductor field effect transistor, having a gate coupled to the second output end, a source coupled to a voltage source, and a drain coupled to the first output end; and an n-type metal oxide semiconductor field effect transistor, having a gate coupled to the second output end, a source coupled to the second comparing end, and a drain coupled to the first output end.

33. The calibrating comparator of claim 24, wherein the controllable capacitive device further comprises:

a capacitor, comprising a first end, and a second end coupled to a ground end;

a positive side switch, comprising a first end coupled to the first comparing end of the latch unit, a second end for receiving the digital data, and a third end coupled to the capacitor, for controlling the conduction between the first end and the third end according to the digital data;

an inverter, for providing the inversion the digital data; and a negative side switch, comprising a first end coupled to the second comparing end of the latch unit, a second end coupled to the inverter, and a third end coupled to the first end of the capacitor, for controlling the conduction between the first end and the third end according to the inversion of the digital data.

34. The calibrating comparator of claim 33, wherein the positive side switch is an n-type metal oxide semiconductor field effect transistor, the first end of the positive side switch is a drain, the second end is a gate, and the third end is a source.

35. The calibrating comparator of claim 33, wherein the negative side switch is an n-type metal oxide semiconductor field effect transistor, the first end of the positive side switch is a drain, the second end is a gate, and the third end is a source.

36. The calibrating comparator of claim 24, wherein the circuit parameter is a resistance value.

37. The calibrating comparator of claim 24, wherein the circuit parameter is a capacitance value.

38. The calibrating comparator of claim 24, wherein the circuit parameter is a product of a resistance value and a capacitance value.

39. The calibrating comparator of claim 24, wherein the capacitor is a Metal-Oxide-Semiconductor Capacitor.

40. The calibrating comparator of claim 24, wherein the controllable capacitive device further comprises:

a plurality of capacitors, each comprising a first end, and a second end coupled to a ground end;

a plurality of positive side switches, each comprising a first end coupled to the first comparing end of the latch unit, a second end for receiving the digital data, and a third end coupled to a corresponding capacitor, for controlling the conduction between the first end and the third end according to the corresponding digital data;

a plurality of inverters, for providing the inversion the corresponding digital data; and a plurality of negative side switches, each comprising a first end coupled to the second comparing end of the latch unit, a second end coupled to the corresponding inverter, and a third end coupled to the first end of the corresponding capacitor, for controlling the conduction between the first end and the third end according to the inversion of the corresponding digital data.

41. The calibrating comparator of claim 40, wherein the capacitance value of the plurality of capacitors presents an increasing power of 2.

42. The calibrating comparator of claim 40, wherein the plurality of the capacitors are Metal-Oxide-Semiconductor Capacitors.

43. The calibrating comparator of claim 40, wherein the plurality of positive side switches are n-type metal oxide semiconductor field effect transistors, the first end of the positive side switch is a drain, the second end is a gate, and the third end is a source.

44. The calibrating comparator of claim 40, wherein the plurality of negative side switches are n-type metal oxide semiconductor field effect transistor, the first end of the positive side switch is a drain, the second end is a gate, and the third end is a source.

* * * * *